United States Patent
Tan et al.

(10) Patent No.: US 11,946,893 B2
(45) Date of Patent: Apr. 2, 2024

(54) METHOD, APPARATUS, ELECTRONIC DEVICE AND STORAGE MEDIUM FOR DETECTING WATER CONTENT IN BATTERY

(71) Applicant: CONTEMPORARY AMPEREX TECHNOLOGY CO., LIMITED, Ningde (CN)

(72) Inventors: Xinyong Tan, Ningde (CN); Zhaoyang Wu, Ningde (CN); Huihua Dong, Ningde (CN); Weihai Yang, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 0 days.

(21) Appl. No.: 18/347,868

(22) Filed: Jul. 6, 2023

(65) Prior Publication Data
US 2023/0349854 A1  Nov. 2, 2023

Related U.S. Application Data

(63) Continuation of application No. PCT/CN2022/090528, filed on Apr. 29, 2022.

(51) Int. Cl.
*G01N 27/22* (2006.01)
*G01R 31/364* (2019.01)
(Continued)

(52) U.S. Cl.
CPC ......... *G01N 27/223* (2013.01); *G01R 31/364* (2019.01); *G01R 31/389* (2019.01); *H01M 10/4285* (2013.01)

(58) Field of Classification Search
CPC .. G01N 27/223; G01R 31/389; G01R 31/364; G01R 31/396; G01R 31/3842;
(Continued)

(56) References Cited

U.S. PATENT DOCUMENTS

2019/0131668 A1* 5/2019 Bitauld ............... H01M 50/204

FOREIGN PATENT DOCUMENTS

| CN | 105044166 A | 11/2015 |
|---|---|---|
| CN | 105866690 A | 8/2016 |

(Continued)

OTHER PUBLICATIONS

International Search Report for International Application PCT/CN2022/090528, dated Jan. 11, 2023.
(Continued)

*Primary Examiner* — Alexander Satanovsky
*Assistant Examiner* — Trung Q Nguyen
(74) *Attorney, Agent, or Firm* — Ladas & Parry LLP

(57) ABSTRACT

A method, an apparatus, an electronic device, and a storage medium for detecting water content in a battery are provided. The method comprises: obtaining a capacitance detection value of a battery to be tested by measurement; and determining a first water content value of the battery to be tested according to the capacitance detection value and a capacitance-water content relationship model. The capacitance-water content relationship model is obtained according to the relationship between sample batteries with different water content values and their sample capacitance values. By pre-constructing the relationship between the water content of the sample battery and the sample capacitance value and determining the water content of the battery to be tested according to the relationship and the capacitance value of the battery to be tested, the step of manually cutting (Continued)

Schematic diagram of measurement principle the electrode sheet is reduced, and the efficiency of detecting the water content in the battery is improved.

17 Claims, 3 Drawing Sheets

(51) Int. Cl.
  *G01R 31/389* (2019.01)
  *H01M 10/42* (2006.01)
(58) Field of Classification Search
  CPC ........... H01M 10/4285; H01M 10/637; H01M 10/4207; H01M 10/425
  USPC ................................................ 324/425–437
  See application file for complete search history.

(56) References Cited

FOREIGN PATENT DOCUMENTS

| | | |
|---|---|---|
| CN | 206420670 U | 8/2017 |
| CN | 215218649 U | 12/2021 |

OTHER PUBLICATIONS

Written Opinion of International Search Authority for International Application PCT/CN2022/090528, dated Jan. 11, 2023.

\* cited by examiner

METHOD, APPARATUS, ELECTRONIC DEVICE AND STORAGE MEDIUM FOR DETECTING WATER CONTENT IN BATTERY

CROSS REFERENCE TO RELATED APPLICATION

This application is a continuation of International Patent Application No. PCT/CN2022/090528, filed on Apr. 29, 2022, which is incorporated by reference in its entirety.

TECHNICAL FIELD

The present application relates to the technical field of battery detection, and specifically to a method, an apparatus, an electronic device, and a storage medium for detecting water content in a battery.

BACKGROUND

In the existing battery production process, too much water content in an electrode sheet will have a great impact on the battery performance, so a water content detection procedure for the electrode sheet is an essential step after the battery is dried.

In the prior art, the electrode sheet is manually removed from a sample battery, and a part of the electrode sheet is cut for water content measurement, which is a relatively inefficient method for detecting the water content in the battery.

SUMMARY

An object of the embodiments of the present application is to provide a method, an apparatus, an electronic device, and a storage medium for detecting water content in a battery, so as to improve the efficiency of detecting the water content in the battery.

In a first aspect, embodiments of the present application provide a method for detecting water content in a battery, comprising: obtaining a capacitance detection value of the battery to be tested by measurement; determining a first water content value of the battery to be tested according to the capacitance detection value and a capacitance-water content relationship model; wherein the capacitance-water content relationship model is obtained according to the corresponding relationship between sample batteries with different water content values and their sample capacitance values.

In the embodiments of the present application, by pre-constructing the corresponding relationship between the water content of the sample battery and the sample capacitance value and determining the water content of the battery to be tested according to the corresponding relationship and the capacitance value of the battery to be tested, the step of manually cutting the electrode sheet is reduced, and the efficiency of detecting the water content in the battery is improved.

In any embodiment, the method further comprises: acquiring a battery temperature of the battery to be tested; correcting the capacitance detection value according to the battery temperature and the temperature-capacitance relationship model to obtain a first corrected capacitance value; accordingly, determining the first water content value of the battery to be tested according to the capacitance detection value and the capacitance-water content relationship model comprises: determining the first water content value of the battery to be tested according to the first corrected capacitance value and the capacitance-water content relationship model.

In the embodiments of the present application, in consideration of the influence of the battery temperature on the capacitance detection value, the battery temperature is utilized to correct the capacitance detection value, which improves the accuracy of the capacitance detection of the battery to be tested, and further improves the accuracy of the water content detection of the battery to be tested.

In any embodiment, the method further comprises: acquiring production parameters of the battery to be tested; correcting the parameters in the capacitance-water content relationship model according to the production parameters to obtain a corrected capacitance-water content relationship model; accordingly, determining the first water content value of the battery to be tested according to the capacitance detection value and the capacitance-water content relationship model comprises: determining the first water content value of the battery to be tested according to the capacitance detection value and the corrected capacitance-water content relationship model.

In the embodiments of the present application, in consideration of the influence of the production parameters on the capacitance of the battery itself, the production parameters of the battery to be tested are utilized to correct the capacitance-water content relationship model, which improves the accuracy of the capacitance detection of the battery to be tested, and further improves the accuracy of the water content detection of the battery to be tested.

In any embodiment, the method further comprises: acquiring a battery temperature and production parameters of the battery to be tested; correcting the capacitance detection value according to the battery temperature and the temperature-capacitance relationship model to obtain a corrected capacitance value; correcting parameters in the capacitance-water content relationship model according to the production parameters to obtain a corrected capacitance-water content relationship model; accordingly, determining the first water content value of the battery to be tested according to the capacitance detection value and the capacitance-water content relationship model comprises: determining the first water content value of the battery to be tested according to the corrected capacitance value and the corrected capacitance-water content relationship model.

In the embodiments of the present application, in consideration of the influence of the battery temperature and production parameters on the capacitance detection value, the battery temperature of the battery to be tested is utilized to correct the capacitance detection value, and the production parameters are utilized to adjust the parameters in the capacitance-water content relationship model, which improves the accuracy of the capacitance detection of the battery to be tested, and further improves the accuracy of the water content detection of the battery to be tested.

In any embodiment, the method further comprises: acquiring the battery temperature of the battery to be tested; and accordingly, determining the first water content value of the battery to be tested according to the capacitance detection value and the capacitance-water content relationship model comprises: according to the battery temperature, acquiring a capacitance-water content relationship model corresponding to the battery temperature from a model library; wherein the model library comprises capacitance-water content relationship models corresponding respectively to a plurality of battery temperatures; and determining the first water content value of the battery to be tested according to the capacitance detection value and the capacitance-water content relationship model corresponding to the battery temperature.

In the embodiments of the present application, in consideration of the influence of the battery temperature on the capacitance detection value, capacitance-water content relationship models at different temperatures are pre-constructed, and a corresponding capacitance-water content relationship model is selected according to the battery temperature, thereby improving the accuracy of the water content detection of the battery to be tested.

In any embodiment, acquiring the battery temperature of the battery to be tested comprises: acquiring an oven-discharging duration of the battery to be tested; and determining the battery temperature of the battery to be tested according to the oven-discharging duration and a duration-temperature relationship function.

In the embodiments of the present application, the battery temperature of the battery to be tested is determined based on the oven-discharging duration of the battery to be tested and the duration-temperature relationship function, so that a temperature detector is saved, and the detection cost is reduced.

In any embodiment, the method further comprises: obtaining sample batteries with different water content values; measuring the sample capacitance values and second water content values of the sample batteries; and constructing a capacitance-water content relationship model according to the sample capacitance values and the second water content values.

In the embodiments of the present application, by pre-constructing the capacitance-water content relationship model, the water content of the battery to be tested is determined according to the capacitance-water content relationship and the capacitance value of the battery to be tested; therefore, in the detection of the water content of the battery to be tested, the water content of the battery to be tested can be obtained by detecting the capacitance value of the battery to be tested, which improves the detection efficiency.

In any embodiment, the sample batteries are obtained by pre-baking and placing in environments with different humidity for a preset duration respectively; or the sample batteries are obtained by baking at the same temperature, but for different durations respectively.

In the embodiments of the present application, by placing the baked sample batteries in the environments with different humidity for the preset duration, the water content on the electrode sheet in the sample battery reaches a stable state, so that a relatively accurate water content in the sample battery is obtained, thereby providing an accurate data basis for constructing the capacitance-water content relationship model. Additionally, in the embodiments of the present application, sample batteries with different water contents are obtained by different baking durations, which is consistent with the procedures in the battery production and improves the efficiency of the battery production.

In any embodiment, obtaining the capacitance detection value of the battery to be tested by measurement comprises: after detecting that the battery to be tested reaches a detection position, controlling a detection probe to be connected to the positive and negative electrodes of the battery to be tested; applying an alternating current of a preset frequency to the battery to be tested through the detection probe, and measuring a capacitive reactance value of the battery to be tested; and obtaining the capacitance detection value of the battery to be tested according to the capacitive reactance value.

In the embodiments of the present application, the capacitance detection value of the battery to be tested is detected by a constant current method, which avoids the influence brought about by the wire resistance in the circuit, and improves the accuracy of obtaining the capacitance detection value.

In a second aspect, embodiments of the present application provide an apparatus for detecting water content in a battery, comprising: a capacitance measurement module for obtaining a capacitance detection value of the battery to be tested by measurement; a water content calculation module for determining a first water content value of the battery to be tested according to the capacitance detection value and a capacitance-water content relationship model; wherein the capacitance-water content relationship model is obtained according to the corresponding relationship between sample batteries with different water content values and their sample capacitance values.

In a third aspect, embodiments of the present application provide an electronic device comprising: a processor, a memory, and a bus, wherein the processor and the memory communicate with each other through the bus; the memory stores program instructions executable by the processor, and the processor calls the program instructions to be able to execute the method in the first aspect.

In a fourth aspect, embodiments of the present application provide a non-transitory computer-readable storage medium comprising: computer instructions stored in the non-transitory computer-readable storage medium, the computer instructions causing the computer to execute the method in the first aspect.

Other features and advantages of the present application will be set forth in the description that follows, and in part will become apparent from the description, or may be learned by practicing the embodiments of the present application. The object and other advantages of the present application can be realized and attained by the structures particularly indicated in the written description and the claims as well as the accompanying drawings.

BRIEF DESCRIPTION OF DRAWINGS

In order to more clearly describe the technical solutions of the embodiments of the present application, the drawings to be used in the embodiments of the present application will be briefly introduced below, and it should be understood that the following drawings only show some embodiments of the present application, and therefore should not be considered as limiting the scope of the present application. For those of ordinary skills in the art, other relevant drawings may also be obtained based on these drawings without creative efforts.

DETAILED DESCRIPTION

Figure 1:
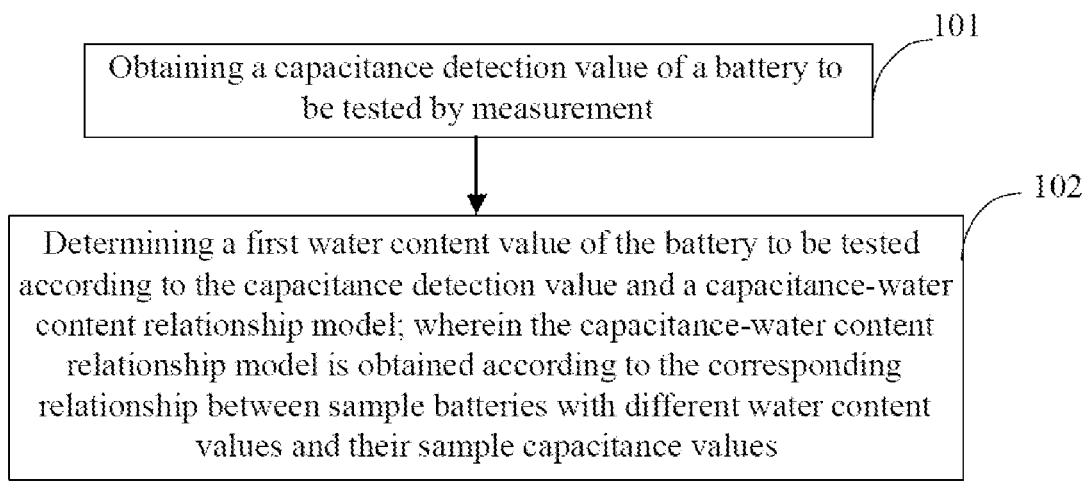
FIG. 1 is a schematic flow chart of a method for detecting water content in a battery provided in an embodiment of the present application.

Examples of the technical solutions of the present application will be described in detail below in conjunction with the drawings. The following embodiments are only used to more clearly illustrate the technical solution of the present application, and therefore are only used as examples and cannot be used to limit the scope of protection of the present application.

Unless otherwise defined, all technical and scientific terms used herein have the same meaning as commonly understood by those skilled in the art belonging to the technical field of the present application; the terms used herein are intended only for the purpose of describing specific examples and are not intended to limit the present application; the terms "including" and "having" and any variations thereof in the specification and the claims of the present application and in the description of drawings above are intended to cover non-exclusive inclusion.

In the description of the embodiments of the present application, the technical terms "first", "second", and the like are used only to distinguish between different objects, and are not to be understood as indicating or implying a relative importance or implicitly specifying the number, particular order, or primary and secondary relation of the technical features indicated. In the description of the embodiments of the present application, the meaning of "a plurality of" is two or more, unless otherwise explicitly and specifically defined.

Reference herein to "an embodiment" means that a particular feature, structure, or characteristic described in connection with the embodiment can be included in at least one embodiment of the present application. The appearance of this phrase in various places in the specification does not necessarily refer to the same embodiment, nor is it a separate or alternative embodiment that is mutually exclusive with other embodiments. It is explicitly and implicitly understood by those skilled in the art that the embodiments described herein may be combined with other embodiments.

In the description of the embodiments of the present application, the term "and/or" is only an association relationship for describing associated objects, indicating that there may be three relationships, for example A and/or B may represent three situations: A exists alone, both A and B exist, and B exists alone. In addition, the character "/" herein generally means that the associated objects before and after it are in an "or" relationship.

In the description of the embodiments of the present application, the term "a plurality of" refers to two or more (including two), and similarly, "multiple groups" refers to two or more (including two) groups, and "multiple sheets" refers to two or more (including two) sheets.

In the description of the embodiments of the present application, the orientation or position relationship indicated by the technical terms "center", "longitudinal", "transverse", "length", "width", "thickness", "upper," "lower," "front," "back," "left," "right," "vertical," "horizontal," "top," "bottom," "inner," "outer," "clockwise," "counterclockwise," "axial", "radial", "circumferential", etc. are based on the orientation or position relationship shown in the drawings and are intended to facilitate the description of the embodiments of the present application and simplify the description only, rather than indicating or implying that the device or element referred to must have a particular orientation or be constructed and operated in a particular orientation, and therefore are not to be interpreted as limitations on the embodiments of the present application.

In the description of the embodiments of the present application, unless otherwise expressly specified and limited, the technical terms "mount," "join," "connect," "fix," etc. should be understood in a broad sense, such as, a fixed connection, a detachable connection, or an integral connection; a mechanical connection, or an electrical connection; a direct connection, an indirect connection through an intermediate medium, an internal connection of two elements, or interaction between two elements. For those of ordinary skill in the art, the specific meanings of the above terms in the embodiments of the present application can be understood according to specific situations.

The present inventors have noted that the water content in the electrode sheet of the battery greatly affects the performance of the battery, and therefore, the detection of the water content in the electrode sheet of the battery is an essential step after the battery is dried. It can be understood that the water content in the electrode sheet of the battery described in the embodiments of the present application can be regarded as the water content in the battery.

The current method for detecting water content in a battery is as follows:

Step I: a sample battery for water content detection is made, and one sample battery for water content detection is placed in a whole tray of batteries, and batteries to be baked are placed elsewhere.

Step II: the whole tray of batteries are placed in an oven for baking, and a fixed baking time is set under specific pressure and temperature conditions.

Step III: the sample battery for water content detection is taken out, and the remaining batteries are returned to the oven, waiting for the detection result of the sample battery for water content detection.

Step IV: parts of anode and cathode sheets of the sample battery for water content detection are cut off respectively, and placed in a water content tester (10 min) (usually coulometric method) to judge whether the water contents of the cathode and anode are within a specified threshold value.

Step V: when the water content is satisfied, the batteries are discharged from the oven. Otherwise, the batteries continue to be baked, and step III to step V are repeated.

As can be seen from the above that, in the current method for detecting water content in a battery, it is necessary to manually remove the electrode sheet from the sample battery and cut a part of the electrode sheet for water content detection, which has a low detection efficiency; and in addition, it is necessary to wait for the result of manual measurement before further production, resulting either in a low battery production efficiency.

In order to solve the problem of low efficiency in detecting water content in a battery, the inventors have found through research that a bare battery can be regarded as a plurality of plate capacitors connected in parallel, the cathode and anode sheets of the bare battery form polar plates, and air and a separator between the electrode sheets form a medium. The capacitance value of a parallel plate capacitor is related to the distance between the two polar plates of the capacitor, the areas of the two polar plates and the dielectric constant of the medium between the polar plates, and the specific relationship is as shown in formula (1):

$$C_1 = \frac{\varepsilon s}{4\pi k d} \quad (1)$$

Wherein $C_1$ is the capacitance, $\varepsilon$ is the dielectric constant of the medium between the two polar plates, S is the facing area of the two polar plates, k is a constant, and d is the distance between the two polar plates.

Ideally, both the distance between the polar plates and the polar plate area are equal for the same type of battery, only the dielectric constant of the medium will change with the water content of the medium, thereby affecting the capacitance value, and the dielectric constant of the medium is positively correlated with the water content of the medium, and the capacitance is positively correlated with the dielectric constant of the medium. Under a certain temperature and pressure condition, when the water content of the medium tends to be in equilibrium with the water content of the electrode sheet, the water content value of the medium is equal to the water content of the electrode sheet. Therefore, the capacitance value of the battery is positively correlated with the water content of the electrode sheet.

Based on the above considerations, the present inventors have proposed that a capacitance value-water content relationship model can be pre-constructed, and in the subsequent water content detection process, the water content in the battery to be tested can be determined according to the capacitance detection value of the battery to be tested and the pre-constructed capacitance-water content relationship model.

The method for detecting water content in a battery described in the embodiments of the present application can be applied to the water content detection of a battery with a capacitor structure inside, for example: a wound battery and a laminated battery. The embodiments of the present application do not specifically limit the type of the battery to be tested.

FIG. 1 is a schematic flow chart of a method for detecting water content in a battery provided in an embodiment of the present application, and as shown in FIG. 1, the method is applied to a detection apparatus, which may be a smart phone, a tablet, a computer, a personal digital assistant (PDA), and an electrochemical workstation, etc. The method comprises:

Step 101: a capacitance detection value of the battery to be tested is obtained by measurement.

Wherein the capacitance detection value can be obtained in various ways, for example: the capacitance detection value of the battery to be tested can be obtained by measuring through an electrochemical workstation, by measuring with an LRC digital bridge, and also by measuring with a multimeter with capacitance detection function. The embodiments of the present application do not limit the specific method for measuring the capacitance detection value.

Since the water content is measured after the battery is baked in the battery production, the battery to be tested is a baked battery.

Step 102: after obtaining the capacitance detection value by measurement, the detection apparatus can determine a first water content value of the battery to be tested according to the capacitance detection value and the capacitance-water content relationship model; it can be understood that the capacitance-water content relationship model is pre-obtained according to the corresponding relationship between sample batteries with different water content values and their sample capacitance values.

Wherein a plurality of sample batteries with different water content values are pre-obtained, the corresponding sample capacitance value of each sample battery is measured respectively, and the capacitance-water content relationship model is obtained according to the relationship between the water content values of the various sample batteries and the sample capacitance values. For example: the least square method can be used to fit the water content values of the sample batteries and the sample capacitance values to obtain the capacitance-water content relationship model, which can be shown by the formula (2):

$$C_2 = KS + C_i \quad (2)$$

Wherein S is the water content value of the sample battery, $C_2$ is the capacitance detection value obtained by measurement, K is a slope, and $C_i$ is the capacitance value of a water-free battery.

It can be understood that the method for measuring the sample capacitance value of the sample battery can also be performed using one of an electrochemical workstation, an LRC digital bridge, and a multimeter with capacitance detection function.

After obtaining the capacitance detection value, this capacitance detection value is substituted into the above formula (2), and the first water content value of the battery to be tested can be obtained.

In the embodiments of the present application, by utilizing the pre-constructed corresponding relationship between the water content of the sample battery and the sample capacitance value and determining the water content of the battery to be tested according to the corresponding relationship and the capacitance value of the battery to be tested, the step of manually cutting the electrode sheet is reduced, the nondestructive online detection of the water content in the battery can be realized, the efficiency of detecting the water content in the battery is improved, and meanwhile, the manpower is also reduced.

On the basis of the above embodiment, in order to overcome the influence of temperature on the capacitance of the battery to be tested, the detection apparatus can first acquire the battery temperature of the battery to be tested; then correct the capacitance detection value according to the battery temperature and a temperature-capacitance relationship model to obtain a first corrected capacitance value; and after obtaining the first corrected capacitance value, the first water content value of the battery to be tested is determined according to the first corrected capacitance value and the capacitance-water content relationship model. It should be noted that the detection apparatus may be an electrochemical workstation, or other terminals capable of executing the method, for which there is no specific limitation in the embodiments of the present application.

In a specific implementation, it can be understood that the capacitance detection value $C_2$ of the battery to be tested can be determined by the capacitance value $C_i$ of the battery to be tested itself, the influence of temperature on capacitance $C_t$ and the influence of water content on capacitance $C_s$, that is, $C_2 = C_i + C_t + C_s$, and the capacitance value of the water-free battery can be expressed as: $C_{it} = C_i + C_t$. Therefore, the capacitance-water content relationship model can also be expressed as: $C_2 = KS + C_{it}$. Here, $C_2$, K and $C_{it}$ are all known, and therefore, the water content value of the battery to be tested can be obtained by calculating $S = (C_2 - C_{it})/K$. For example: $C_2 = 2.8$ μF, $C_{it} = 2.6$ μF, $K = 0.001$, and after substituting the parameter values into the above formula, the water content value S=200 ppm can be obtained by calculation.

There are various methods to obtain the battery temperature of the battery to be tested, for example: the battery temperature of the battery to be tested can be measured by a temperature sensor; if the battery to be tested is just taken out from an oven, the temperature in the oven can be used as the battery temperature of the battery to be tested; and it is also possible to estimate the battery temperature according to the duration after the battery to be tested is taken out from the oven. The embodiments of the present application do not limit the method for obtaining the battery temperature.

A temperature-capacitance relationship model is pre-constructed according to different battery temperature differences and corresponding battery capacitance value differences, wherein the battery temperature difference value refers to the difference value with respect to the temperature when the capacitance-water content relationship model is constructed, for example: when the capacitance-water content relationship model is constructed, the battery temperature of the sample battery is 170° C., then battery capacitance value differences corresponding respectively to −10° C., −20° C., −30° C. . . . from 170° C., as well as battery capacitance value differences corresponding respectively to 10° C., 20° C., 30° C. . . . from 170° C. can be obtained respectively. The above battery temperature differences and the corresponding battery capacitance value differences are fitted to obtain the temperature-capacitance relationship model. It should be noted that the above is exemplified at an interval of 10° C., and in practical applications, the temperature interval can be larger or smaller, and the temperature interval can be different. Additionally, for different types of batteries, the capacitance is affected differently by temperature, and therefore, different types of batteries can correspond to different temperature-capacitance relationship models, and the temperature-capacitance relationship model in the embodiments of the present application is a model matching the type of the battery to be tested. For convenience of subsequent description, the process of constructing the capacitance-water content relationship model is referred to as the experimental process, and the temperature of the sample battery in the experimental process is referred to as the sample battery temperature.

After the battery temperature is obtained, since the battery temperature may be different from the temperature of the sample battery when the capacitance-water content relationship model is constructed, the temperature-capacitance relationship model can be utilized to determine the deviation between the capacitance detection value corresponding to the battery to be tested at the current battery temperature and the sample capacitance value of the sample battery when the model is constructed, and the deviation is utilized to correct the capacitance detection value, thus obtaining the first corrected capacitance value.

After obtaining the first corrected capacitance value, the first corrected capacitance value is substituted into formula (2) to obtain the first water content value of the battery to be tested by calculation.

In the embodiments of the present application, in consideration of the influence of the battery temperature on the capacitance detection value, the battery temperature is utilized to correct the capacitance detection value, which improves the accuracy of the capacitance detection of the battery to be tested, and further improves the accuracy of the water content detection of the battery to be tested.

On the basis of the above embodiments, since the production process may cause an error in the capacitance value of the battery itself, and it can be seen from formula (2) that the capacitance-water content relationship model comprises the capacitance value of the water-free battery, that is, the capacitance value of the battery itself, and therefore, in order to overcome the influence of the production parameters on the capacitance value of the battery itself, the detection apparatus can acquire the production parameters of the battery to be tested, and correct the parameters in the capacitance-water content relationship model according to the production parameters to obtain a corrected capacitance-water content relationship model; and after obtaining the corrected capacitance-water content relationship model, the first water content value of the battery to be tested is determined according to the capacitance detection value and the corrected capacitance-water content relationship model.

It should be noted that the detection apparatus may be an electrochemical workstation, or other terminals capable of executing the method, for which there is no specific limitation in the embodiments of the present application.

In a specific implementation, even the same type of battery may have different production parameters in the production process, for example: the length and width of the battery electrode sheet, the thickness of the electrode sheet after cold pressed, etc. Moreover, the actual production parameters of the battery will be recorded in the battery production process. According to formula (1), the production parameters will affect the capacitance value of the battery itself. After obtaining the actual production parameters of the battery to be tested, the capacitance value of the water-free battery can be calculated according to formula (1), and then the capacitance value of the water-free battery can be utilized to replace $C_{it}$ in the capacitance-water content relationship model to obtain the corrected capacitance-water content relationship model. Then, the capacitance detection value is input into the corrected capacitance-water content relationship model to obtain the first water content value of the battery to be tested.

In the embodiments of the present application, since the capacitance value of the water-free battery in the pre-constructed capacitance-water content relationship model is obtained by fitting, and it is a fixed value, in order to improve the accuracy of obtaining the first water content value, the production parameters of the battery to be tested can be utilized to recalculate the capacitance value of the water-free battery, and the recalculated capacitance value of the water-free battery is utilized to optimize the capacitance-water content relationship model, thereby achieving the purpose of improving the accuracy of obtaining the first water content value.

On the basis of the above embodiments, the inventors have found through research that both the battery temperature and the production parameters affect the measurement of the water content in the battery, and therefore, the detection apparatus can acquire the battery temperature and production parameters of the battery to be tested; wherein the battery temperature is used to correct the capacitance detection value, and the production parameters are used to correct the parameters in the capacitance-water content relationship model. For example: according to the battery temperature and the temperature-capacitance relationship model, the capacitance detection value is corrected to obtain the corrected capacitance value; according to the production parameters, the parameters in the capacitance-water content relationship model are corrected to obtain the corrected capacitance-water content relationship model; and after obtaining the corrected capacitance value and the corrected capacitance-water content relationship model, the first water content value of the battery to be tested is determined according to the corrected capacitance value and the corrected capacitance-water content relationship model.

It can be understood that the detection apparatus may be an electrochemical workstation, or other terminals capable of executing the above method, and there is no specific limitation on the detection apparatus in the embodiments of the present application.

In a specific implementation, the battery temperature and production parameters of the battery to be tested can be acquired by referring to the above embodiments, and the corrected capacitance value and the corrected capacitance-water content relationship model are also obtained by referring to the above embodiments, which will not be repeated here.

After obtaining the corrected capacitance value and the corrected capacitance-water content relationship model, the corrected capacitance value is input into the corrected capacitance-water content relationship model to obtain the first water content value.

In the embodiments of the present application, in consideration of the influence of the battery temperature and production parameters on the capacitance detection value, the battery temperature of the battery to be tested is utilized to correct the capacitance detection value, and the production parameters are utilized to adjust the parameters in the capacitance-water content relationship model, which improves the accuracy of the capacitance detection of the battery to be tested, and further improves the accuracy of the water content detection of the battery to be tested.

On the basis of the above embodiments, the detection apparatus can pre-construct capacitance-water content relationship models corresponding respectively to different battery temperatures to form a model library. After the detection apparatus acquires the battery temperature of the battery to be tested, it acquires capacitance-water content relationship model corresponding to the battery temperature from the model library, and determines the first water content value of the battery to be tested according to the capacitance detection value and the acquired capacitance-water content relationship model.

It should be noted that the detection apparatus may be an electrochemical workstation, or other terminals capable of executing the method, for which there is no specific limitation in the embodiments of the present application.

Here, the sample capacitance value and the water content of the sample battery at different temperatures are obtained, the relationship between the sample capacitance value and the water content is constructed, the capacitance-water content relationship models at different temperatures are obtained, that is: $C=f(S)$, and the model library is generated.

After the battery temperature of the battery to be tested is obtained, the capacitance-water content relationship model matching the battery temperature is acquired from the model library. It should be noted that if the sample battery temperatures corresponding to capacitance-water content relationship models in the model library are not equal to the battery temperature, the capacitance-water content relationship model corresponding to the sample battery temperature closest to the battery temperature is selected, and the capacitance detection value is input into the capacitance-water content relationship model to obtain the first water content value.

In the embodiments of the present application, in consideration of the influence of the battery temperature on the capacitance detection value, capacitance-water content relationship models at different temperatures are pre-constructed, and a corresponding capacitance-water content relationship model is selected according to the battery temperature, thereby improving the accuracy of the water content detection of the battery to be tested.

On the basis of the above embodiments, the step of acquiring the battery temperature of the battery to be tested may comprise:

Acquiring an oven-discharging duration of the battery to be tested by the detection apparatus, and determining the battery temperature of the battery to be tested corresponding to the oven-discharging duration by utilizing a duration-temperature relationship function. It should be noted that the detection apparatus may be an electrochemical workstation, or other terminals capable of executing the method, for which there is no specific limitation in the embodiments of the present application.

In a specific implementation, the battery temperature of the battery to be tested can be acquired not only by measuring with a temperature sensor, but also by predicting based on the oven-discharging duration of the battery to be tested.

The oven-discharging duration refers to the duration from the time when the battery to be tested is taken out from the oven to the time when the capacitance detection value of the battery to be tested is measured.

The duration-temperature relationship function is obtained by starting in advance from the temperature within the oven, measuring the temperature of the sample battery every certain period of time, and fitting the oven-discharging duration of the sample battery with the temperature of the sample battery. Here, when the duration-temperature relationship function is obtained, the temperature within the oven is the same as the oven temperature when the battery to be tested is baked.

After obtaining the oven-discharging duration, the oven-discharging duration is substituted into the duration-temperature relationship function, and the battery temperature of the battery to be tested is obtained by calculation.

In the embodiments of the present application, the battery temperature of the battery to be tested is determined based on the oven-discharging duration of the battery to be tested and the duration-temperature relationship function, so that a temperature detector is saved, and the detection cost is reduced.

On the basis of the above embodiments, the capacitance-water content relationship model can be constructed by the following steps:

Obtaining sample batteries with different water content values by the detection apparatus; and measuring the sample capacitance value and a second water content value of each sample battery; and then, constructing the capacitance-water content relationship model according to the sample capacitance values and the second water content values obtained by measurement. It should be noted that the detection apparatus may be an electrochemical workstation, or other terminals capable of executing the method, for which there is no specific limitation in the embodiments of the present application.

In a specific implementation, the sample batteries with different water content values are of the same type, and after obtaining the sample batteries with different water content values, the sample capacitance value of each sample battery can be measured by an electrochemical workstation, and the second water content value on the battery electrode sheet of the sample battery is measured by a Karl Fischer moisture analyzer.

Figure 2:
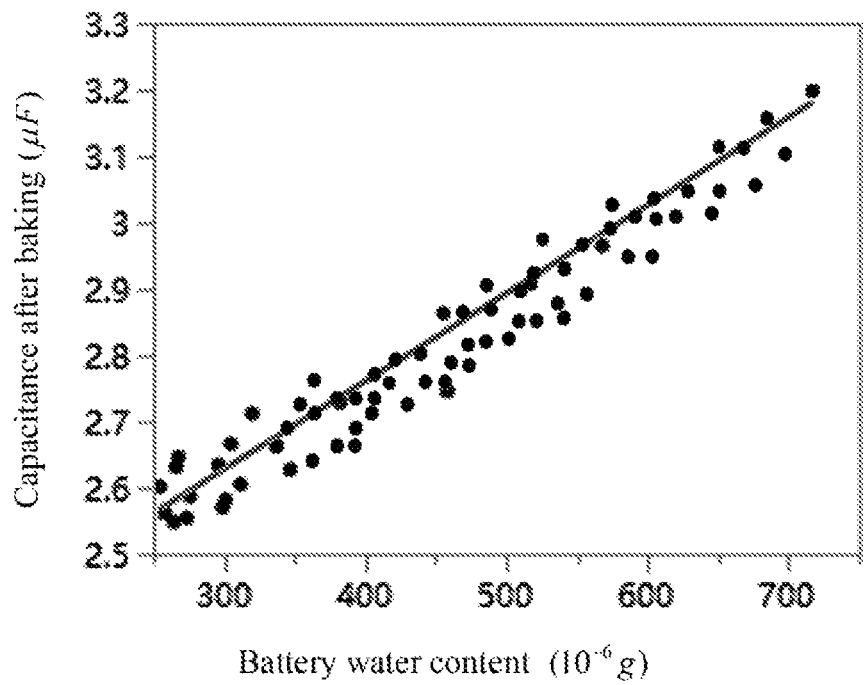
FIG. 2 is a graph obtained by fitting the second water content value and the sample capacitance value in Table 1.

Table 1 and FIG. 2 are obtained according to the sample capacitance value and the corresponding second water content value of each sample battery, wherein FIG. 2 is obtained by fitting the second water content value and the sample capacitance value in Table 1, and it can be understood that the least square method can be used for fitting.

TABLE 1

| Second Water Content Value | Sample Capacitance Value |
|---|---|
| S1 | C1 |
| S2 | C2 |
| S3 | C3 |
| ... | ... |
| Sn | Cn |

When the electrochemical workstation is utilized to measure the sample capacitance value of the sample battery, a capacitive reactance value of the sample battery can be measured first, and then the sample capacitance value of the sample battery can be calculated by formula (3).

$$C = \frac{1}{\omega X_c} = \frac{1}{2\pi f X_c} \quad (3)$$

Here, C is the sample capacitance value, ω is an angular velocity; $X_c$ is the capacitive reactance value of the sample battery, and f is a frequency.

It can be understood that the capacitance detection value of the battery to be tested can also be obtained by the above calculation method.

In the embodiments of the present application, by pre-constructing the capacitance-water content relationship model, the water content of the battery to be tested is determined according to the capacitance-water content relationship and the capacitance value of the battery to be tested; therefore, in the detection of the water content of the battery to be tested, the water content of the battery to be tested can be obtained by detecting the capacitance value of the battery to be tested, which improves the detection efficiency.

On the basis of the above embodiments, the sample batteries are obtained by pre-baking and placing in environments with different humidity for a pre-set duration.

In a specific implementation, a pre-set number of baked sample batteries of the same type are screened out, such as 30 batteries, numbered 1-30; the sample battery 1 is measured by an electrochemical workstation, and its sample capacitance value is obtained by calculation, and then the second water content value of its battery electrode sheet is measured by a Karl Fischer moisture analyzer, so as to obtain the second water content value S1 corresponding to the sample capacitance value C1.

Then the sample batteries 2-30 are placed into a constant temperature and humidity test chamber with 5% humidity for a sufficient long time to ensure that the internal water content values of the sample batteries are stable, and then the sample battery 2 are taken out for the following tests: measuring by an electrochemical workstation and calculating to obtain the sample capacitance value C2 of the sample battery 2, and then measuring by the Karl Fischer moisture analyzer to obtain the second water content value S2 of its battery electrode sheet.

Then the test chamber is set to reach a target humidity for a certain period of time, and then the sample batteries 3-30 are taken out successively, and the above test steps are repeated, so as to obtain the sample capacitance values and the second water content values corresponding respectively to the sample batteries with different water content values.

It should be noted that the humidity value can be comprehensively set according to the humidity range of the test chamber, the number of the sample batteries, the karl Fischer moisture analyzer and the manual measurement error, for example: the influence of humidity difference value between two adjacent groups of experimental batteries on the water contents in the batteries needs to be far greater than the sum of the measurement error of the Karl Fischer moisture analyzer and the manual error.

In the embodiments of the present application, by placing the baked sample batteries in the environments with different humidity for the preset duration, the water content on the electrode sheet in the sample battery reaches a stable state, so that a relatively accurate water content in the sample battery is obtained, thereby providing an accurate data basis for constructing the capacitance-water content relationship model.

In another embodiment, the sample batteries are obtained respectively through the same baking temperature and different baking durations.

In a specific implementation, a pre-set number of unbaked sample batteries of the same type are acquired, such as 30 batteries, numbered 31-60; the sample battery 31 is taken out, measured by an electrochemical workstation, and its capacitance value is obtained by calculation, and then the water content of the battery electrode sheet of the sample battery 31 is measured by a Karl Fischer moisture analyzer, so as to obtain the sample water content S31 corresponding to a second capacitance value C31.

The sample battery numbered 32-60 are placed into the oven and baked for a pre-set duration, such as for 5 minutes, and the sample battery 32 is taken out from the oven, measured by an electrochemical workstation, and its second capacitance value C32 is obtain by calculation, and then the sample water content value S32 of its battery electrode sheet is measured by a Karl Fischer moisture analyzer.

Then, the sample batteries numbered 33-60 are continued to be baked, and each time the pre-set duration is reached, a sample battery is taken out from the oven, and the second capacitance value and the sample water content of the sample battery are measured. It is also possible to obtain a table similar to Table 1 and a graph of capacitance value vs water content obtained by fitting the second capacitance value and the sample water content similar to FIG. 2.

In the embodiments of the present application, sample batteries with different water contents are obtained by different baking durations, which is consistent with the procedures in the battery production and improves the efficiency of the battery production.

On the basis of the above embodiments, the steps for measuring the capacitance detection value of the battery to be tested comprise:

After detecting by the detection apparatus that the battery to be tested reaches a detection position, controlling a detection probe to be connected to the positive and negative electrodes of the battery to be tested to form a circuit; applying an alternating current with a constant voltage to the battery to be tested through the detection probe, and measuring a capacitive reactance value of the battery to be tested; and after obtaining the capacitive reactance value, obtaining the capacitance detection value of the battery to be tested according to the capacitive reactance value. It can be understood that the detection apparatus may be an electrochemical workstation, and of course it may also be other terminals capable of running the method, for which there is no specific limitation in the embodiments of the present application.

Figure 3:
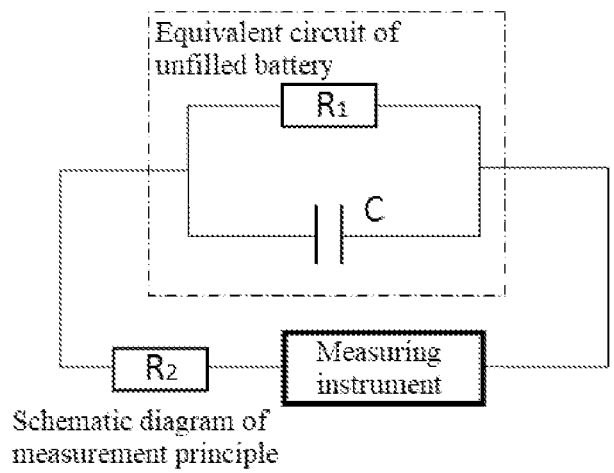
FIG. 3 is a schematic diagram of the measurement principle provided by the embodiments of the present application.

In a specific implementation, a movable probe mechanism is arranged on the blanking belt after baking the battery, and when the battery to be tested is blocked in place, the detection apparatus controls the probe mechanism to descend, and the detection probe on the probe mechanism comes into contact with the positive and negative electrodes of the battery to be tested. FIG. 3 is a schematic diagram of the measurement principle provided by the embodiments of the present application, and as shown in FIG. 3, the measuring instrument can be an electrochemical workstation, wherein R1 is an internal resistor of the battery to be tested, C is a capacitor formed by the electrode sheets of the battery to be tested, and R2 is a wire resistor. The electrochemical workstation starts to work, and applies an alternating current with a constant voltage to the positive and negative electrodes of the battery to be tested through the detection probe, with a frequency being 100 Hz-10000 Hz, and an excitation voltage amplitude being 0.0001v-10v; for example: the frequency can be 1000 Hz, and the excitation voltage amplitude is 0.01 volt (V). The electrochemical workstation measures the capacitive reactance value of the battery to be tested, and then calculates according to the capacitive reactance value to obtain the capacitance detection value of the battery to be tested.

It can be understood that, it is also possible to apply an alternating current with a constant current to the battery to be tested through the detection probe, with a frequency range being 100 Hz-10000 Hz, and an excitation voltage amplitude being 0.001 A-1 A. For example: an alternating current with a frequency of 1000 Hz and an amplitude of 0.1 A.

In the embodiments of the present application, the capacitance detection value of the battery to be tested is detected by a constant current method, which avoids the influence brought about by the wire resistance in the circuit, and improves the accuracy of obtaining the capacitance detection value.

Figure 4:
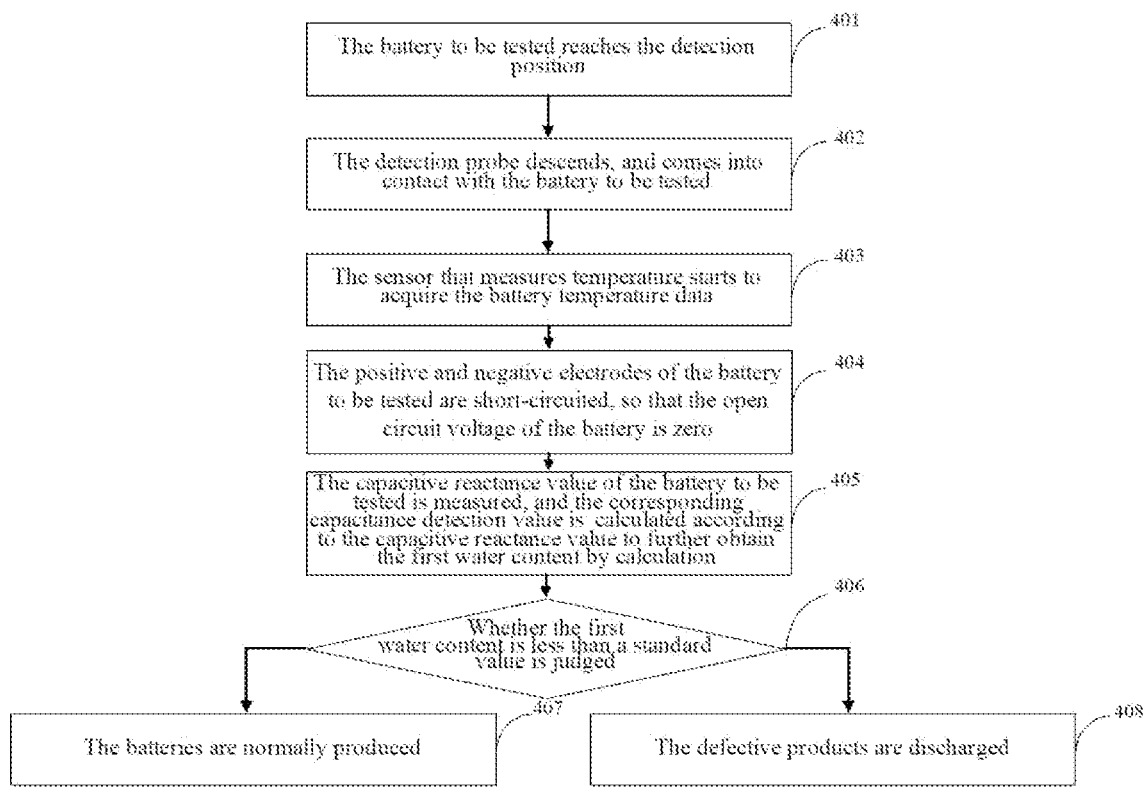
FIG. 4 is a schematic flow chart of another method for detecting water content in a battery to be tested provided in an embodiment of the present application.

FIG. 4 is a schematic flow chart of another method for detecting water content in a battery to be tested provided in an embodiment of the present application, and as shown in FIG. 4, the method is illustrated by way of example of testing the water content after the battery is baked at a high temperature, and comprises:

Step 401: the detection apparatus detects that the battery to be tested reaches the detection position;

Step 402: the detection apparatus controls the detection probe to descend, so that the detection probe comes into contact with the two electrodes of the battery to be tested;

Step 403: the detection apparatus comprises a temperature sensor, and the battery temperature data is acquired through the temperature sensor;

Step 404: the positive and negative electrodes of the battery to be tested are short-circuited, so that the open circuit voltage of the battery is zero;

Step 405: the detection apparatus measures the capacitive reactance value of the battery to be tested, and calculates the corresponding capacitance detection value according to the capacitive reactance value; specifically, the capacitance detection value can be obtained by calculation according to formula (3), and then the first water content is obtained by calculation according to formula (1).

Step 406: the detection apparatus judges whether the first water content is less than a standard value, and if so, step 407 is executed, otherwise step 408 is executed.

Step 407: the batteries are normally produced;

Step 408: the defective products are discharged.

Figure 5:
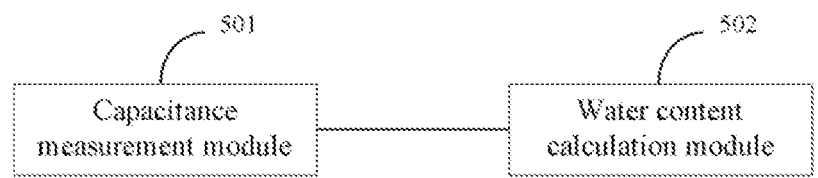
FIG. 5 is a schematic structural diagram of an apparatus for detecting water content in a battery provided in an embodiment of the present application.

FIG. 5 is a schematic structural diagram of an apparatus for detecting water content in a battery provided in an embodiment of the present application, wherein the apparatus can be a module, a program segment or a code on an electronic device. It should be understood that the apparatus corresponds to the above method embodiment of FIG. 1, and is capable of carrying out the various steps involved in the method embodiment of FIG. 1, and that the specific functions of the apparatus can be referred to the above description, and the detailed description is appropriately omitted here to avoid repetition. The apparatus comprises: a capacitance measurement module 501 and a water content calculation module 502, wherein:

The capacitance measurement module 501 is used for obtaining the capacitance detection value of the battery to be tested by measurement; and the water content calculation module 502 is used for determining the first water content value of the battery to be tested according to the capacitance detection value and the capacitance-water content relationship model; wherein the capacitance-water content relationship model is obtained according to the corresponding relationship between sample batteries with different water content values and their sample capacitance values.

On the basis of the above embodiments, the apparatus further comprises:

a temperature acquisition module for acquiring the battery temperature of the battery to be tested; wherein the purpose of acquiring the battery temperature is to correct the capacitance detection value;

a first correction module for correcting the capacitance detection value according to the acquired battery temperature and the pre-constructed temperature-capacitance relationship model to obtain the first corrected capacitance value; and accordingly, the water content calculation module 502 is specifically used for:

determining the first water content value of the battery to be tested according to the first corrected capacitance value and the capacitance-water content relationship model.

On the basis of the above embodiments, the apparatus further comprises:

a parameter acquisition module further for acquiring the production parameters of the battery to be tested; wherein the purpose of acquiring the production parameters is to correct the parameters in the capacitance-water content relationship model;

a second correction module for correcting the parameters in the capacitance-water content relationship model according to the obtained production parameters of the battery to be tested to obtain the corrected capacitance-water content relationship model; and accordingly, the water content calculation module 502 is specifically used for:

determining the first water content value of the battery to be tested according to the capacitance detection value and the corrected capacitance-water content relationship model.

On the basis of the above embodiments, the apparatus further comprises:

a temperature acquisition module for acquiring a battery temperature and production parameters of the battery to be tested; wherein the battery temperature is used to correct the capacitance detection value, and the production parameters are used to correct the parameters in the capacitance-water content relationship model;

a third correction module for correcting the capacitance detection value according to the battery temperature and a temperature-capacitance relationship model to obtain a corrected capacitance value; and correcting parameters in the capacitance-water content relationship model according to the production parameters to obtain a corrected capacitance-water content relationship model; and accordingly, the water content calculation module 502 is specifically used for:

determining the first water content value of the battery to be tested according to the corrected capacitance value and the corrected capacitance-water content relationship model.

On the basis of the above embodiments, the apparatus further comprises:

a temperature acquisition module for acquiring the battery temperature of the battery to be tested; and accordingly, the water content calculation module 502 is specifically used for:

acquiring the capacitance-water content relationship model corresponding to the battery temperature from a model library according to the battery temperature; wherein the model library comprises capacitance-water content relationship models corresponding respectively to a plurality of battery temperatures;

determining the first water content value of the battery to be tested according to the capacitance detection value and the capacitance-water content relationship model corresponding to the battery temperature.

On the basis of the above embodiments, the temperature acquisition module is specifically used for:

acquiring the oven-discharging duration of the battery to be tested;

determining the battery temperature of the battery to be tested according to the oven-discharging duration and the duration-temperature relationship function.

On the basis of the above embodiments, the apparatus further comprises:

a battery acquisition module for acquiring sample batteries with different water content values;

a measurement module for measuring the sample capacitance value and the second water content value of the sample battery;

a model construction module for constructing the capacitance-water content relationship model according to the sample capacitance values and the second water content values.

On the basis of the above embodiments, the sample batteries are obtained by pre-baking and placing in environments with different humidity for a pre-set duration; or, the sample batteries are obtained respectively through the same baking temperature and different baking durations.

On the basis of the above embodiments, the capacitance measurement module is specifically used for:

after detecting that the battery to be tested reaches the detection position, controlling the detection probe to be connected to the positive and negative electrodes of the battery to be tested;

applying an alternating current with a constant voltage to the battery to be tested through the detection probe, and measuring the capacitive reactance value of the battery to be tested;

obtaining the capacitance detection value of the battery to be tested according to the capacitive reactance value.

Figure 6:
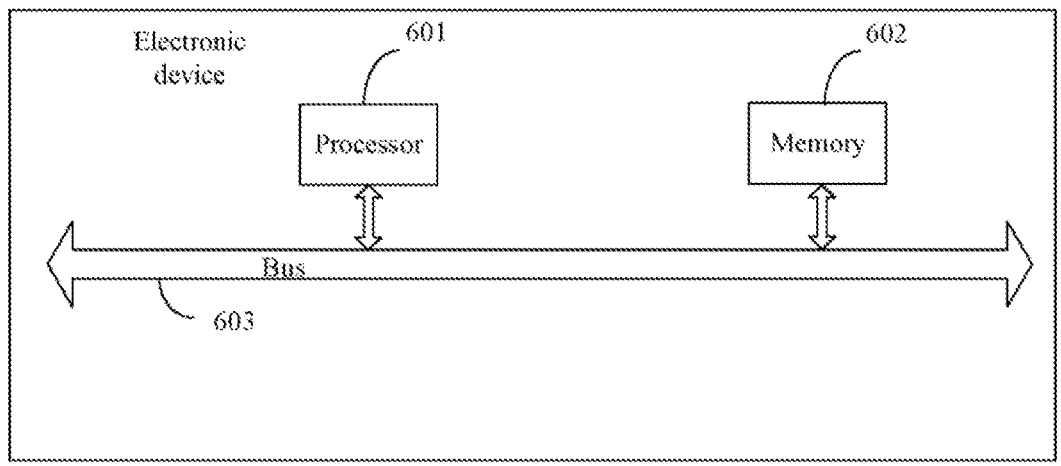
FIG. 6 is a schematic diagram of the physical structure of an electronic device provided in an embodiment of the present application.

FIG. 6 is a schematic diagram of the physical structure of an electronic device provided in an embodiment of the present application, and as shown in FIG. 6, the electronic device comprises: a processor 601, a memory 602 and a bus 603; wherein the processor 601 and the memory 602 communicate with each other through the bus 603;

the processor 601 is used to call the program instructions in the memory 602 to execute the method provided in the above method embodiments, such as comprising: obtaining the capacitance detection value of the battery to be tested by measurement; determining the first water content value of the battery to be tested according to the capacitance detection value and the capacitance-water content relationship model; wherein the capacitance-water content relationship model is obtained according to the corresponding relationship between sample batteries with different water content values and their sample capacitance values.

The processor 601 may be an integrated circuit chip with signal processing capability. The above processor 601 may be a general-purpose processor, including a central processing unit (CPU), a network processor (NP), etc.; and it may also be a digital signal processor (DSP), an application-specific integrated circuit (ASIC), a field programmable gate array (FPGA) or other programmable logic device, discrete gate or transistor logic device and discrete hardware component. It can implement or execute various methods, steps and logic blocks disclosed in the embodiments of the present application. A general-purpose processor may be a microprocessor, or the processor may also be any conventional processor, or the like.

Memory 602 may include, but is not limited to, a random access memory (RAM), a read-only memory (ROM), a programmable read-only memory (PROM), an erasable programmable read-only memory (EPROM) and an electrically erasable programmable read-only memory (EEPROM), etc.

This embodiment discloses a computer program product comprising a computer program stored on a non-transitory computer-readable storage medium, the computer program comprising program instructions which, when executed by a computer, enable the computer to execute the method provided in the various method embodiments described above, such as comprising: obtaining the capacitance detection value of the battery to be tested by measurement; determining the first water content value of the battery to be tested according to the capacitance detection value and the capacitance-water content relationship model; wherein the capacitance-water content relationship model is obtained according to the corresponding relationship between sample batteries with different water content values and their sample capacitance values.

This embodiment provides a non-transitory computer-readable storage medium storing computer instructions that cause the computer to execute the method provided in the various method embodiments described above, such as comprising: obtaining the capacitance detection value of the battery to be tested by measurement; determining the first water content value of the battery to be tested according to the capacitance detection value and the capacitance-water content relationship model; wherein the capacitance-water content relationship model is obtained according to the corresponding relationship between sample batteries with different water content values and their sample capacitance values.

In the embodiments provided by the present application, it should be understood that the disclosed apparatuses and methods can be implemented by other means. The apparatus embodiment described above is only illustrative. For example, the division of the units is only a logical function division. In an actual implementation, there may be other division methods.

As another example, a plurality of units or components may be combined or may be integrated into another system, or some features may be omitted, or may not be implemented. In another aspect, the mutual coupling or direct coupling or communication connection shown or discussed can be an indirect coupling or communication connection through some communication interfaces, apparatuses or units, and can be electrical, mechanical or in other forms.

Additionally, the units illustrated as separate components may or may not be physically separated, and the components shown as units may or may not be physical units, that is, may be located in one place, or may be distributed over multiple network units. Some or all of the units may be selected according to actual needs to achieve the purpose of the solution in this embodiment.

Furthermore, various functional modules in various embodiments of the present application may be integrated together to form a separate part, or the various modules may exist separately, or two or more modules may be integrated to form a separate part.

Herein, relational terms such as first and second etc. are only used to distinguish one entity or operation from another entity or operation, and do not necessarily require or imply any actual relationship or order between these entities or operations.

The above descriptions are only embodiments of the present application, and are not intended to limit the scope of protection of the present application. For those skilled in the art, various modifications and changes may be made to the present application. Any modifications, equivalent replacements, and improvements, etc. made within the spirit and principle of the present application shall be included within the scope of protection of the present application.

What is claimed is:

1. A method for determining water content in a battery, comprising:
    obtaining a capacitance detection value of the battery; and
    determining a first water content value of the battery according to the capacitance detection value and a capacitance-water content relationship model;
    wherein the capacitance-water content relationship model is constructed according to corresponding relationships between sample batteries with different water content values and their respective sample capacitance values; and
    wherein obtaining the capacitance detection value of the battery comprises:
    after determining that the battery reaches a detection position, connecting a detection probe to positive and negative electrodes of the battery;
    applying an alternating current with a constant voltage to the battery through the detection probe, and measuring a capacitive reactance value of the battery; and
    obtaining the capacitance detection value of the battery according to the capacitive reactance value of the battery.

2. The method according to claim 1, further comprising:
    acquiring a battery temperature of the battery; and
    correcting the capacitance detection value according to the battery temperature and a temperature-capacitance relationship model, to obtain a corrected capacitance value;
    wherein determining the first water content value of the battery according to the capacitance detection value and the capacitance-water content relationship model comprises:
    determining the first water content value of the battery according to the corrected capacitance value and the capacitance-water content relationship model.

3. The method according to claim 2, wherein acquiring the battery temperature of the battery comprises:
    obtaining an oven-discharging duration of the battery; and
    determining the battery temperature of the battery according to the oven-discharging duration and a duration-temperature relationship function.

4. The method according to claim 1, further comprising:
    acquiring production parameters of the battery; and
    correcting parameters in the capacitance-water content relationship model according to the production parameters, to obtain a corrected capacitance-water content relationship model;
    wherein determining the first water content value of the battery according to the capacitance detection value and the capacitance-water content relationship model comprises:
    determining the first water content value of the battery according to the capacitance detection value and the corrected capacitance-water content relationship model.

5. The method according to claim 1, further comprising:
    acquiring a battery temperature and production parameters of the battery;
    correcting the capacitance detection value according to the battery temperature and a temperature-capacitance relationship model, to obtain a corrected capacitance value; and
    correcting parameters in the capacitance-water content relationship model according to the production parameters, to obtain a corrected capacitance-water content relationship model;
    wherein determining the first water content value of the battery according to the capacitance detection value and the capacitance-water content relationship model comprises:
    determining the first water content value of the battery according to the corrected capacitance value and the corrected capacitance-water content relationship model.

6. The method according to claim 1, further comprising:
    acquiring a battery temperature of the battery;
    wherein determining the first water content value of the battery according to the capacitance detection value and the capacitance-water content relationship model comprises:
    acquiring a capacitance-water content relationship model corresponding to the battery temperature from a model library according to the battery temperature, wherein the model library comprises capacitance-water content relationship models corresponding respectively to a plurality of battery temperatures; and
    determining the first water content value of the battery according to the capacitance detection value and the capacitance-water content relationship model corresponding to the battery temperature.

7. The method according to claim 1, further comprising:
    obtaining the sample batteries with different water content values;
    measuring the sample capacitance values and second water content values of the sample batteries; and constructing the capacitance-water content relationship model according to the sample capacitance values and the second water content values.

8. The method according to claim 7, wherein
the sample batteries with different water content values are obtained by pre-baking sample batteries and placing the sample batteries in environments with different humidity for a pre-set duration; or
the sample batteries with different water content values are obtained by pre-baking the sample batteries in a same baking temperature for different baking durations.

9. An apparatus for determining water content battery, comprising:
a battery measurement unit; and
a computing device in communication with the battery measurement unit;
wherein the computing device comprises a processor and a memory storing program instructions executable by the processor;
wherein the program instructions, when executed by the processor, cause apparatus to:
obtain a capacitance detection value of the battery; and
determine a first water content value of the battery according to the capacitance detection value and a capacitance-water content relationship model;
wherein the capacitance-water content relationship model is constructed according to corresponding relationships between sample batteries with different water content values and their respective sample capacitance values; and
wherein in obtaining the capacitance detection value of the battery, the battery measurement unit is configured to:
after determining that the battery reaches a detection position, connect a detection probe to positive and negative electrodes of the battery;
apply an alternating current with a constant voltage to the battery through the detection probe. and measuring a capacitive reactance value of the battery; and
obtain the capacitance detection value of the battery according to the capacitive reactance value of the battery.

10. The apparatus according to claim 9, wherein the program instructions, when executed by the processor, further cause the apparatus to:
acquire a battery temperature of the battery; and
correct the capacitance detection value according to the battery temperature and a temperature-capacitance relationship model, to obtain a corrected capacitance value;
wherein in determining the first water content value of the battery according to the capacitance detection value and the capacitance-water content relationship model, the apparatus is configured to:
determine the first water content value of the battery according to the corrected capacitance value and the capacitance-water content relationship model.

11. The apparatus according to claim 10, wherein in acquiring the battery temperature of the battery, the apparatus is configure to:
obtain an oven-discharging duration of the battery; and
determine the battery temperature of the battery according to the oven-discharging duration and a duration-temperature relationship function.

12. The apparatus according to claim 9, wherein the program instructions, when executed by the processor, further cause the apparatus to:
acquire production parameters of the battery; and
correct parameters in the capacitance-water content relationship model according to the production parameters, to obtain a corrected capacitance-water content relationship model;
wherein in determining the first water content value of the battery according to the capacitance detection value and the capacitance-water content relationship model, the apparatus is configured to:
determine the first water content value of the battery according to the capacitance detection value and the corrected capacitance-water content relationship model.

13. The apparatus according to claim 9, wherein the program instructions, when executed by the processor, further cause the apparatus to:
acquire a battery temperature and production parameters of the battery;
correct the capacitance detection value according to the battery temperature and a temperature-capacitance relationship model, to obtain a corrected capacitance value; and
correct parameters in the capacitance-water content relationship model according to the production parameters, to obtain a corrected capacitance-water content relationship model;
wherein in determining the first water content value of the battery according to the capacitance detection value and the capacitance-water content relationship model, the apparatus is configured to:
determine the first water content value of the battery according to the corrected capacitance value and the corrected capacitance-water content relationship model.

14. The apparatus according to claim 9, wherein the program instructions, when executed by the processor, further cause the apparatus to:
acquire a battery temperature of the battery;
wherein in determining the first water content value of the battery according to the capacitance detection value and the capacitance-water content relationship model, the apparatus is configured to:
acquire a capacitance-water content relationship model corresponding to the battery temperature from a model library according to the battery temperature, wherein the model library comprises capacitance-water content relationship models corresponding respectively to a plurality of battery temperatures; and
determine the first water content value of the battery according to the capacitance detection value and the capacitance-water content relationship model. corresponding to the battery temperature.

15. The apparatus according to claim 9, wherein the program instructions, when executed by the processor, further cause the apparatus to:
obtain the sample batteries with different water content values;
measure the sample capacitance values and second water content values of the sample batteries, and
construct the capacitance-water content relationship model according to the sample capacitance values and the second water content values.

16. The apparatus according to claim 15, wherein
the sample batteries with different water content values are obtained by pre-baking sample batteries and placing the sample batteries in environments with different humidity for a pre-set duration; or the sample batteries with different water content values are obtained by pre-baking the sample batteries in a same baking temperature for different baking durations.

17. A non-transitory computer-readable storage medium storing computer instructions which, when executed by a computer processor, cause a device having the processor and a battery measurement unit to execute a method for determining water content in a battery, wherein the method comprises:
obtaining a capacitance detection value of the battery; and
determining a first water content value of the battery according to the capacitance detection value and a capacitance-water content relationship model;
wherein the capacitance-water content relationship model is constructed according to corresponding relationships between sample batteries with different water content values and their respective sample capacitance values; and
wherein obtaining the capacitance detection value of the battery comprises;
after determining that the battery reaches a detection position, connecting a detection probe to positive and negative electrodes of the battery;
applying an alternating current with a constant voltage to the battery through the detection probe, and measuring a capacitive reactance value of the battery; and
obtaining the capacitance detection value of the batten according to the capacitive reactance value of the battery.

* * * * *